(12) United States Patent
Wun-Fogle et al.

(10) Patent No.: US 6,489,695 B1
(45) Date of Patent: Dec. 3, 2002

(54) EFFICIENCY MAXIMIZED CONVERSION OF ELECTRICAL TO MECHANICAL ENERGY BY MAGNETOSTRICTIVE TRANSDUCTION

(75) Inventors: Marilyn Wun-Fogle, Potomac, MD (US); James B. Restorff, College Park, MD (US); Arthur E. Clark, Adelphi, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 61 days.

(21) Appl. No.: 09/770,795

(22) Filed: Jan. 24, 2001

(51) Int. Cl.$^7$ .............................. H01L 41/20; H02N 2/02
(52) U.S. Cl. ........................................ 310/26; 318/118
(58) Field of Search ........................... 310/26; 318/118; 335/215

(56) References Cited

U.S. PATENT DOCUMENTS

| | | | |
|---|---|---|---|
| 4,873,480 A | * 10/1989 | Lafferty | ...................... 323/229 |
| 4,906,879 A | 3/1990 | Clark | ........................... 310/26 |
| 5,039,894 A | 8/1991 | Teter et al. | ..................... 310/26 |
| 5,041,753 A | 8/1991 | Clark et al. | .................. 310/328 |
| 5,289,998 A | * 3/1994 | Bingley et al. | ............. 244/173 |
| 5,510,660 A | * 4/1996 | Flatau et al. | ................... 310/26 |
| 5,600,239 A | 2/1997 | Hathaway et al. | ........... 324/209 |
| 5,693,154 A | 12/1997 | Clark et al. | ..................... 310/12 |
| 5,728,062 A | * 3/1998 | Brisken | ........................ 604/22 |
| 5,868,375 A | * 2/1999 | Reinicke et al. | ........ 251/129.21 |
| 5,985,049 A | * 11/1999 | Pinkerton et al. | ............ 148/301 |
| 6,017,402 A | * 1/2000 | Sukigara et al. | ............. 148/301 |
| 6,364,221 B1 | * 4/2002 | Czimmek | ................. 239/585.1 |
| 2002/0057156 A1 | * 5/2002 | Czimmek | ..................... 336/30 |

* cited by examiner

Primary Examiner—Nestor Ramirez
Assistant Examiner—Judson H. Jones
(74) Attorney, Agent, or Firm—Jacob Shuster

(57) ABSTRACT

The efficiency of converting electrical energy into a mechanical output is maximized by alternatively matching selection of power supply for the drive coil applying a magnetic field to transducer element made of a magnetostrictive material having a near-zero magnetic anisotropy, or matching selection of the magnetostrictive material to the required magnetostriction for a given power supply.

5 Claims, 1 Drawing Sheet

EFFICIENCY MAXIMIZED CONVERSION OF ELECTRICAL TO MECHANICAL ENERGY BY MAGNETOSTRICTIVE TRANSDUCTION

The present invention relates in general to magnetostrictive transducer devices through which electrical energy is converted into mechanical energy output.

BACKGROUND OF THE INVENTION

Magnetostrictive materials are now being used as transducer elements in a variety of installations such as high power underwater sound projectors and high strain active vibration isolators. Electrical energy sources providing a high power supply are usually required for such installations in order to generate relatively large dynamic magnetic fields. Frequently, the capability of the power supply for such installations limits the mechanical output to be produced. Also in order to obtain good efficiency in converting the electrical energy within such installations, the magnetostrictive transducer output under stress and strain is matched to the expected load impedance. It is therefore an important object of the present invention to avoid the mechanical output limitation heretofore experienced in the aforementioned type of energy conversion installations while providing acceptably good conversion efficiency.

SUMMARY OF THE INVENTION

In accordance with the present invention, energy conversion efficiency for high power installations involving magnetostrictive transduction is maximized by either matching the magnetostrictive material to the power source or matching the power source to the required strain imposed by loading on magnetostrictive transduction material having a near zero magnetic anisotropy.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENT

Figure 1:
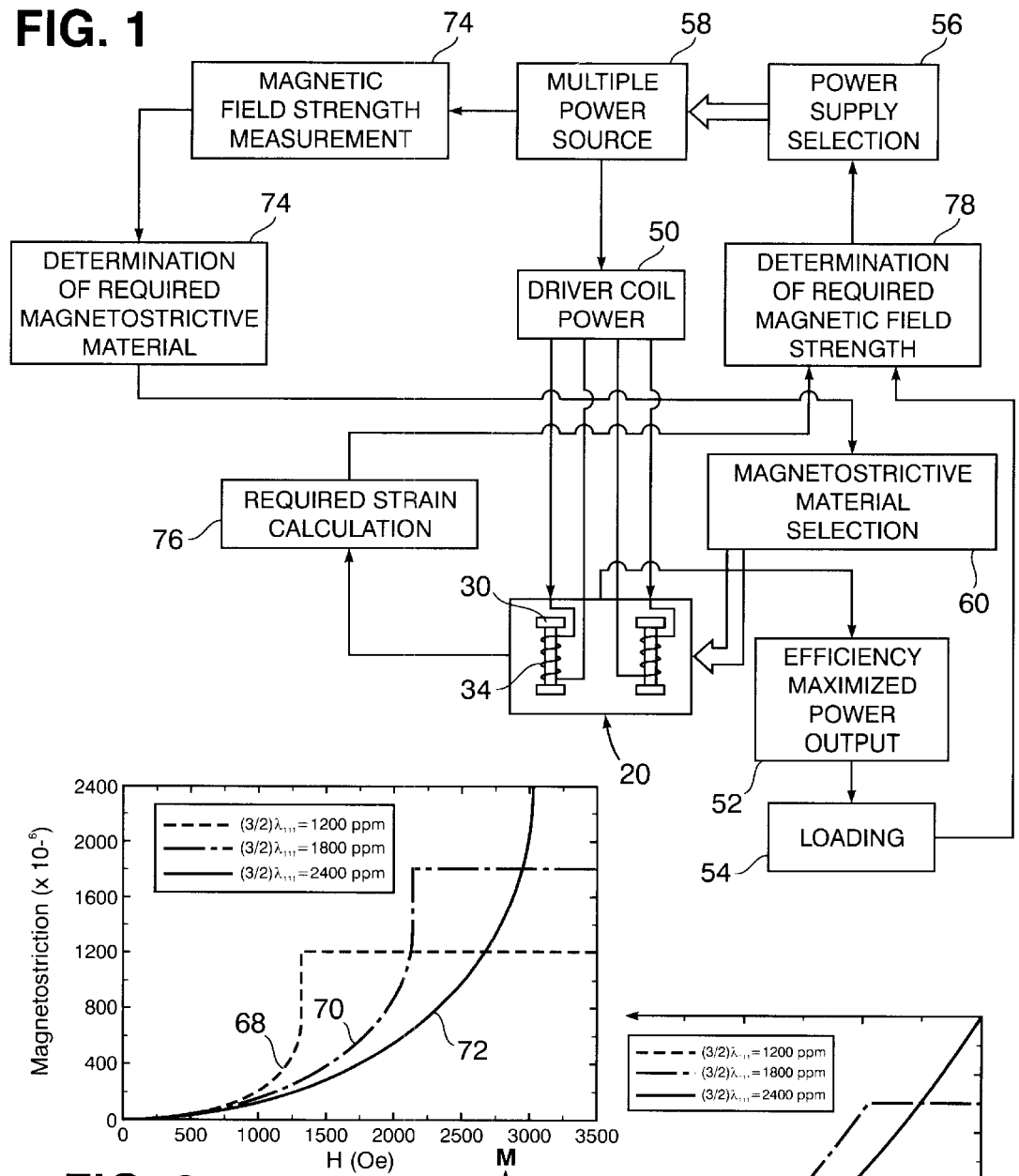
FIG. 1 is a schematic block diagram of alternative procedure associated with a magnetostrictive transduction module having its output conversion efficiency maximized, involving matching of power source selection and load imposed strain, or matching magnetostrictive material selection and strength of magnetic field imposed by the power source.

Referring now to the drawing in detail, FIG. 1 diagrams a pair of magnetostrictive transducers forming parts of a simple type of magnetization rotation module 20, such as those associated with the magnetic motor disclosed in U.S. Pat. No. 5,041,753 to Clark et al. In general, such magnetostrictive transducers of the module 20 convert magnetic energy produced by a change in magnetic field into mechanical energy in the form of dimensional change in its magnetostrictive element 30, as described for example in the earlier U.S. Pat. No. 4,906,879 to Clark. Each magnetostrictive element 30 is formed from a material having a ratio $\lambda 2/K$ of high value, where $(\lambda)$ is the material magnetostriction and (K) is its magnetic anisotropy. Positioned about each magnetostrictive element 30 is an electrical drive coil 34. According to yet another U.S. Pat. No. 5,600,239 to Clark et al., strain of the magnetostrictive element 30 by energization of its drive coil 34 may be determined by optical means or resistive strain gauges, such strain being caused by a magnetic field of strength (H) within which the magnetostrictive element 30 is disposed. The material of element 30 has a saturation magnetostriction $(\lambda_s)=2M_s\Delta H/3\sigma$, where $(M_s)$ is the saturated magnetization of the material of module 20, $(2\Delta H)$ is the maximum magnetic field which can be applied through the drive coil 34 and $(\sigma)$ is the compressive stress under which the transducer must operate.

With continued reference to the diagramming in FIG. 1, energization of the transducer drive coils 34 of the module 20 is effected by driver coil power 50 to produce an efficiency maximized power output 52 for the mechanical loading imposed by a load 54, pursuant to the present invention. The efficiency of such power output 52 is maximized by selection 56 of the power supply from a multiple power source 58 from which the driver coil power 50 is derived, given a particular magnetostrictive material for the elements 30 having a near zero magnetic anisotropy (K) and a particular loading imposed by the mechanical load 54. Conversely, given particular values for driver coil power 50 and load 54, power output efficiency is maximized by selection 60 of the material for the magnetostrictive elements 30. In either case, there is an energy loss within each drive coil 34 equal to $I^2R$, where (I) is the electrical current conducted through the drive coil 34. For the simple type module 20 diagrammed, the current I=H/n, where (n) is the number of turns per unit length of the drive coil 34. Transduction is therefore most efficient when the strength of the required magnetic field (H), provided by the drive coil 34, is as low as possible to obtain the desired maximum mechanical work $(W_{max})$ per volume of the transducer material in the magnetostrictive element 30. Based on the foregoing, the maximum mechanical work $W_{max}=\sigma\xi max$, where $(\sigma)$ is the compressive stress imposed by the load 54, and $(\xi_{max})$ is the maximum available fractional change in length for the material of the magnetostrictive element 30. Such maximum change in transducer length $(\xi_{max})$ equals (3/2) times its saturation magnetostriction $(\lambda_s)$, so that $W_{max} \sim (3/2)\lambda_s\sigma$ and loss $\sim H^2$.

Figure 3:
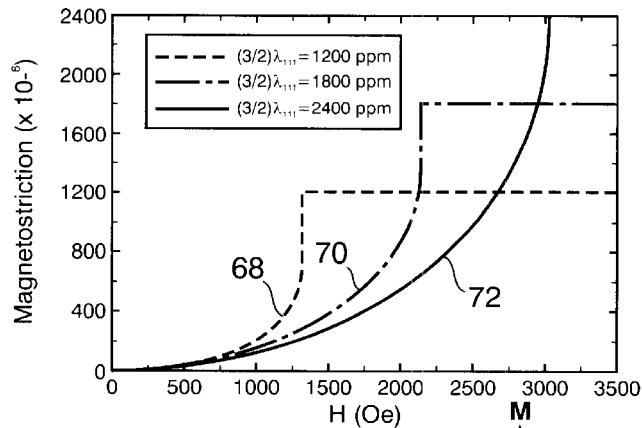
FIGS. 2 and 3 are graphical representations of data utilized for the alternative matching procedures diagrammed in FIG. 1.
Figure 2:
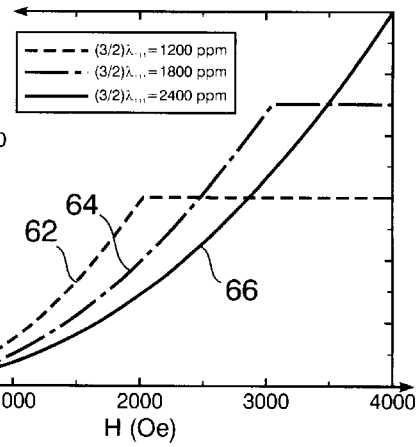

From simple theory, it can be shown that $M_sH_{min}=3\lambda_s\sigma$, as reflected by data graphically depicted in FIG. 2, where $(M_s)$ is the saturated magnetization (1T) for the transducer material of the module 20. FIG. 2 plots magnetostriction strain vs magnetic field strength (H) for a typical load (67 MPa) per unit area of transducer material, in terms of three different values of $(3/2\lambda_s)$, respectively reflected by curves 62, 64 and 66. Thus, to obtain the maximum efficiency for the module 20 the power supply is selected to yield the maximum magnetic field $H=3\lambda_s\sigma/M_s$. Where the magnetostrictive material has a significant anisotropy (K), a more complicated theory is involved graphically reflected in FIG. 3 by curves 68, 70 and 72 wherein $\sigma=63$ MPa and $K=-3\times10^4$J/m$^3$. The same procedure is however utilized, to obtain maximum efficiency.

Referring again to FIG. 1, the procedure based on the foregoing described theory for obtaining maximum efficiency involves measurement 74 of magnetic field strength for determination 76 of the required magnetostriction. Such determination 74 is utilized to effect selection 60 of the magnetostrictive material for the transducer elements 30.

Alternatively, calculation 76 of the required strain for the module 20 is performed. Such calculation 76 together with data from loading 54 is applied for determination 78 of required magnetic field strength utilized as the basis for power supply selection 56.

Obviously, other modifications and variations of the present invention may be possible in light of the foregoing teachings. It is therefore to be understood that within the scope of the appended claims the invention may be practiced otherwise than as specifically described.

What is claimed is:

1. In combination with a device for conversion of electrical energy from a power source into mechanical energy applied to a load through a transducer module having a magnetostrictive element and a drive coil connected to said power source through which a magnetic field is applied to the magnetostrictive element; said magnetostrictive element and the drive coil being operationally interrelated with the load and the power source in accordance with factors establishing drive of the load by said mechanical energy; the improvement residing in: maximizing efficiency of said conversion by selection of magnitude for the power source given a material for the magnetostrictive element.

2. The improvement as defined in claim 1, wherein said selection of the magnitude of the power source includes: calculating strain to be imposed on the transducer module during said conversion to determine strength of the magnetic field associated with said selection of the power source magnitude.

3. The improvement as defined in claim 1, wherein said material for the magnetostrictive element has a near zero magnetic anisotropy.

4. In combination with a device for conversion of electrical energy from a power source of fixed magnitude into mechanical energy applied to a load through a transducer module having a magnetostrictive element and a drive coil connected to said power source through which a magnetic field is applied to the magnetostrictive element which is operationally interrelated with the load, the power source and the drive coil in accordance with factors establishing drive of the load by said mechanical energy; the improvement residing in: maximizing efficiency of said conversion by selection of a material for the magnetostrictive element.

5. The improvement as defined in claim 4, wherein said selection of the material for the magnetostrictive element includes: measuring strength of the magnetic field produced by the power source through the drive coil during said conversion to affect said selection of the material.

* * * * *